United States Patent [19]

Carlson et al.

[11] 4,453,173
[45] Jun. 5, 1984

[54] PHOTOCELL UTILIZING A WIDE-BANDGAP SEMICONDUCTOR MATERIAL

[75] Inventors: David E. Carlson, Yardley, Pa.; Brown F. Williams, Princeton, N.J.

[73] Assignee: RCA Corporation, New York, N.Y.

[21] Appl. No.: 372,103

[22] Filed: Apr. 27, 1982

[51] Int. Cl.³ .............. H01L 45/00; H01L 27/14; H01L 31/00; H01L 29/04
[52] U.S. Cl. .................................... 357/30; 357/2; 357/59; 136/258
[58] Field of Search .................. 357/30, 2, 59; 136/258 AM

[56] References Cited

U.S. PATENT DOCUMENTS

| | | | |
|---|---|---|---|
| 4,064,521 | 12/1977 | Carlson | 357/2 |
| 4,109,271 | 8/1978 | Pankove | |
| 4,163,987 | 8/1979 | Kamath | 357/30 |
| 4,217,148 | 8/1980 | Carlson | 357/2 |
| 4,253,882 | 3/1981 | Dalal | 357/30 |
| 4,358,782 | 11/1982 | Takasuka | 357/30 |
| 4,388,848 | 6/1983 | Hamakawa et al. | 357/2 |

OTHER PUBLICATIONS

"a–SiC:H/a–Si:H Heterojunction Solar Cell Having More than 7.1% Conversion Efficiency" by Y. Tawada et al., *Appl. Phys. Lett.* 39 (3) Aug., 81.

*Primary Examiner*—Martin H. Edlow
*Assistant Examiner*—Jerome Jackson
*Attorney, Agent, or Firm*—Birgit E. Morris; Donald S. Cohen; William J. Burke

[57] ABSTRACT

A photocell comprises a p-i-n amorphous silicon structure having a wide bandgap layer adjacent to either the p-type or n-type layer. This structure reduces the absorption of light entering the photocell and the back-diffusion of minority carriers.

8 Claims, 1 Drawing Figure

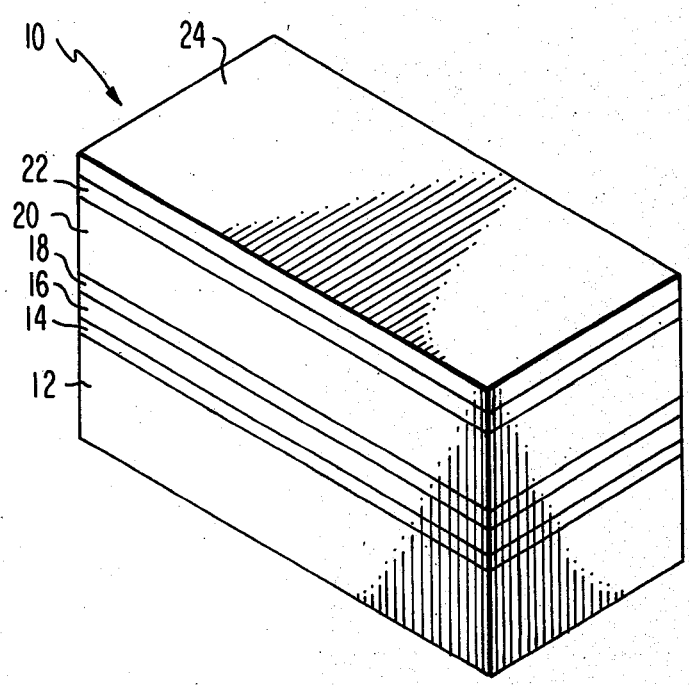

PHOTOCELL UTILIZING A WIDE-BANDGAP SEMICONDUCTOR MATERIAL

The U.S. Government has rights in this invention under Contract No. XG-0-9372-1 with the Solar Energy Research Institute.

The invention relates to an amorphous silicon photocell and, in particular, to a photocell utilizing a wide bandgap amorphous material.

BACKGROUND OF THE INVENTION

Carlson in U.S. Pat. No. 4,064,521, incorporated herein by reference, has disclosed a photocell incorporating amorphous silicon fabricated in a glow discharge in a silane gas as the light sensitive material. The photocell typically consists of a comparatively thick, about 500 nanometers (nm), layer of intrinsic amorphous silicon bounded by thin, opposed p-type and n-type layers, each about 10 nm thick, with the light entering the device through either the p-type or n-type layer. The p-type and n-type layers are highly absorbing and carriers generated therein typically recombine before they reach the depletion region of the device to be collected as current. There is a limit to how thin these layers can be made to avoid this problem since, if the layer is too thin, there is insufficient space charge available to fully deplete the intrinsic region. Thus the optimum thickness of the p- and n-type layers are typically chosen as a compromise between low absorption and sufficient space charge.

Pankove, in U.S. Pat. No. 4,109,271, incorporated herein by reference, has disclosed that silicon deposited in an atmosphere which includes carbon forms an amorphous silicon-carbon alloy which has a wider bandgap, and thus less absorption, than amorphous silicon. A suitably doped amorphous silicon-carbon alloy is substituted for either the p-type or n-type layer through which light enters the photocell, thereby reducing the magnitude of the absorption in this layer. However, the thickness of the silicon-carbon alloy is limited by the transport of majority carriers through this layer to an electrode since the transport appears to occur through gap states rather than the band states. The optimum thickness of the silicon carbon alloy layer is then also a compromise between a thin layer sufficient for good charge transport and a thick layer which provides sufficient space charge to fully deplete the intrinsic region. It would thus be desirable to have a photocell structure which can make use of a material such as a silicon-carbon alloy having the desired wide bandgap properties but which will also have good majority carrier transport properties and sufficient space charge to fully deplete the intrinsic region of the device.

SUMMARY OF THE INVENTION

The invention is a p-i-n amorphous silicon photocell having a layer of a semiconductor material overlying either the p-type or n-type layer and having a wider bandgap than that layer.

BRIEF DESCRIPTION OF THE DRAWING

The FIGURE is a perspective view of a photocell of the invention.

DETAILED DESCRIPTION OF A PREFERRED EMBODIMENT

In the Figure, the photocell 10 includes a window 12, a first electrical contact 14 overlying the surface of the window 12, a wide bandgap semiconductor layer 16 overlying the electrical contact 14, a first layer 18 of amorphous silicon overlying the wide bandgap layer 16, a second layer 20 of intrinsic amorphous silicon overlying the first layer 18, a third layer 22 of amorphous silicon overlying the second layer 20 and a second electrical contact 24 overlying the third layer 22.

The first and third layers, 18 and 22 respectively, have opposite conductivity types and the wide bandgap semiconductor layer 16 has the same conductivity type as the first layer 18.

The window 12 is typically substantially transparent to light over the wavelength range from about 400 to 1,000 nanometers (nm). The thickness of the window may be sufficient to support the remainder of the structure, thus serving the function of a substrate, or it may be of a thickness such that the window is an antireflection coating for the photocell 10. The first and second electrical contacts 14 and 24 are each composed of an electrical conductor thick enough to transport the electrical current generated in the photocell without excessive resistive losses. The first electrical contact 14 is also substantially transmissive of light over the wavelength range between about 400 and 1,000 nm and is typically composed of a transparent conductive oxide such as indium-tin oxide or a thin metal layer. Alternatively, the functions of the window 12 and the first electrical contact 14 may be combined into one substantially transmissive and electrically conductive layer. The second electrical contact 24 may be a metal such as steel having a thickness sufficient to support the remainder of the photocell, thereby serving as a substrate for the photocell.

The wide bandgap semiconductor layer 16 is typically between about 5 and 50 nm thick and is composed of a material which has a bandgap energy of about 1.8 electron volts (eV) or greater. If this layer is p-type conducting, it is preferably composed of an amorphous silicon-carbon alloy in which the ratio of carbon to silicon is between about 0.1 and about 1. If this layer is n-type conducting, it may be composed of a silicon-carbon alloy or a silicon-nitrogen alloy in which the ratio of nitrogen to silicon is between 0.1 and 1. The carbon or nitrogen concentration may be uniform with thickness or it may be graded from a maximum concentration adjacent to the first electrical contact to a minimum or zero concentration at the interface with the first layer 18. The advantage of gradation of the carbon or nitrogen concentration is that it can provide a built-in effective field which helps to separate photogenerated carriers in the wide bandgap layer. Gradation can also eliminate notches which occur at heterojunction interfaces due to differences in electron affinities for n-type material and in the sum of the electron affinities and bandgaps for p-type material. Moreover, graduation may also reduce interface states found at a heterojunction.

The first layer is typically between about 5 and 50 nm thick and is composed of amorphous silicon containing a conductivity modifying dopant in a uniform atomic concentration of about $10^{20}/cm^3$. Alternatively, the dopant concentration may be graded from a maximum at the interface with the wide bandgap layer 16 to zero at a thickness of several hundred nm or it may be graded through both the wide-bandgap and the first layer. The dopant profile may be adjusted to optimize the electric field distribution in the active region of the cell. The second amorphous silicon layer is between about 300 and 1,000 nm thick and is composed of substantially intrinsic amorphous silicon which includes undoped, compensated or slightly n-type or p-type conducting material. The third layer 22 is typically between about 5 and 50 nanometers thick and is composed of amorphous silicon containing a conductivity modifying dopant having an atomic concentration of about $10^{21}/cm^3$.

The wide-bandgap semiconductor layer 16, the first layer 18, the second layer 20, and the third layer 22 are described herein as being composed of amorphous silicon or alloys containing amorphous silicon. It is to be understood that these layers also contain hydrogen in a concentration typically between about 5 and 20 atomic percent and preferably about 10 atomic percent, and may also contain other halogen ions such as fluorine, chlorine, bromine and iodine.

The hydrogen-containing amorphous silicon layers may be sequentially deposited using the method disclosed in U.S. Pat. No. 4,064,521. The silicon-carbon and silicon-nitrogen alloys may be deposited using the method disclosed in U.S. Pat. No. 4,109,271.

The performance of the present p-i-n amorphous silicon photocells containing hydrogen are limited by the quality of the doped p-type and n-type layers and by the presence of back-diffusion of carriers in the vicinity of either the intrinsic-n-type or intrinsic-p-type junctions. The doped layers typically contain a few atomic percent of either boron or phosphorous, depending upon their conductivity types, and, consequently, exhibit short recombination times for carriers generated therein and high optical absorption, especially for boron doped films, which reduces the penetration of the incident light into the intrinsic layer. The utility of the photocell of the invention lies in the fact that the wide bandgap and first layers will be relatively light transmissive, so that most of the incident light can enter the intrinsic amorphous silicon layer and be converted into photogenerated carriers therein. The thin, doped wide-bandgap layer also provides a portion of the space charge required for depletion of the intrinsic layer with the first doped, amorphous silicon layer providing the remainder. This reduces the required dopant level in the first layer thereby reducing the recombination losses and the absorption in this region. Thus, the first layer need not be either heavily-doped or thick. Another advantage of this structure is that the wide bandgap material will inhibit the back-diffusion of local minority carriers generated in the intrinsic amorphous silicon layer when the photocell operates in forward bias, i.e. when the internal field in the cell is low.

We claim:

1. A photocell comprising:
   a wide bandgap layer of a semiconductor material; and
   a first layer of hydrogen-containing amorphous silicon of a first conductivity type overlying the wide bandgap layer;
   a second layer of hydrogen-containing amorphous silicon overlying said first layer and having substantially intrinsic conductivity;
   a third layer of hydrogen-containing amorphous silicon overlying the second layer and having the opposite conductivity type to the first layer;
   means for electrically contacting the wide bandgap and third layers;
   wherein the wide bandgap layer has a bandgap energy greater than that of the first layer and has the same conductivity type as the first layer.

2. The article of claim 1 wherein the wide bandgap layer is composed of an amorphous material which contains silicon, hydrogen and an element selected from the group consisting of carbon and nitrogen.

3. The article of claim 1 wherein the wide bandgap layer is a silicon-carbon alloy.

4. The article of claim 3 wherein the silicon-carbon alloy has a bandgap energy greater than about 1.8 electron volts.

5. The article of claim 1 or 3 wherein the wide bandgap and first layers have p-type conductivity, and the third layer has n-type conductivity.

6. The article of claim 1 wherein the means for electrically contacting the third layer is a metal layer over the third layer and the means for electrically contacting the wide bandgap layer is a transparent conducting oxide layer over the wide bandgap layer.

7. The article of claim 1 wherein the concentration of a conductivity modifying dopant in the first layer is graded in decreasing concentration from the portion thereof adjacent to the wide bandgap layer.

8. The article of claim 1 wherein the concentration of a conductivity modifying dopant in the wide bandgap and first layers is graded in decreasing concentration from the portion thereof adjacent to the electrical contact to the wide bandgap.

* * * * *